(12) United States Patent
Matsuoka et al.

(10) Patent No.: US 7,680,367 B2
(45) Date of Patent: Mar. 16, 2010

(54) OPTOELECTRONIC INTEGRATED CIRCUIT BOARD AND COMMUNICATIONS DEVICE USING THE SAME

(75) Inventors: Yasunobu Matsuoka, Hachioji (JP); Masato Shishikura, Ome (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 351 days.

(21) Appl. No.: 11/719,319

(22) PCT Filed: Nov. 16, 2005

(86) PCT No.: PCT/JP2005/020997

§ 371 (c)(1),
(2), (4) Date: May 15, 2007

(87) PCT Pub. No.: WO2006/054569

PCT Pub. Date: May 26, 2006

(65) Prior Publication Data

US 2009/0080830 A1    Mar. 26, 2009

(30) Foreign Application Priority Data

Nov. 17, 2004   (JP) ............................ 2004-332673

(51) Int. Cl.
*G02B 6/42* (2006.01)
(52) U.S. Cl. .............................. 385/14; 385/31; 385/32; 385/129; 385/130; 385/131; 385/132
(58) Field of Classification Search ................... 385/14, 385/31–32, 129–132
See application file for complete search history.

(56) References Cited

U.S. PATENT DOCUMENTS

| 6,804,423 B2 * | 10/2004 | Tsukamoto et al. ........... 385/14 |
| 7,139,448 B2 * | 11/2006 | Jain et al. ..................... 385/14 |
| 7,263,256 B2 * | 8/2007 | Kim et al. ..................... 385/32 |

FOREIGN PATENT DOCUMENTS

| JP | 05-264833 | 10/1993 |
| JP | 07-168055 | 7/1995 |
| JP | 2000-066064 | 3/2000 |

(Continued)

*Primary Examiner*—Frank G Font
*Assistant Examiner*—Michael P Mooney
(74) *Attorney, Agent, or Firm*—Antonelli, Terry, Stout & Kraus, LLP.

(57) ABSTRACT

In the optical connection between multi-layered optical waveguides and photoelectric converting elements or optical waveguide array connectors formed on a substrate, the optical coupling efficiency is to be prevented from degrading due to deviation of the optical axis positions between optical elements and the optical waveguide layers that is caused by a radiation due to a beam expansion or by a deviation of positioning layers in producing the optical waveguides. There are stacked, on a substrate, optical waveguide layers, each of which comprises a clad layer and a core having a higher refractive index than the clad layer, and optical elements formed on the uppermost optical waveguide layer. The optical elements are positioned such that they correspond to the optical path conversion mirrors of the cores of the underlaying optical waveguide layer. The light transmission/reception between the optical elements and the optical path conversion mirrors of the cores of the underlaying optical waveguide layer is performed via the cores of overlying optical waveguide layer.

11 Claims, 9 Drawing Sheets

FOREIGN PATENT DOCUMENTS

| | | |
|---|---|---|
| JP | 2001-185752 | 7/2001 |
| JP | 2002-040302 | 2/2002 |
| JP | 2003-114365 | 4/2003 |
| JP | 2003-232966 | 8/2003 |
| JP | 2004-020767 | 1/2004 |
| JP | 2004-177730 | 6/2004 |

* cited by examiner

IN THE CASE OF PASSING THROUGH:
- ● TAPERED CORE (STRUCTURE SHOWN IN FIG.5)
- ◆ ISOLATED CORE (STRUCTURE SHOWN IN FIG.4)
- △ CORE OF UPPER LAYER (STRUCTURE SHOWN IN FIG.1)
- ○ CLADDING LAYER

OPTOELECTRONIC INTEGRATED CIRCUIT BOARD AND COMMUNICATIONS DEVICE USING THE SAME

TECHNICAL FIELD

The present invention relates to an optical wiring structure and an optical coupling system of an optoelectronic integrated circuit capable of processing high-capacity optical signals transmitted and received between substrates in a communication device and a communication device using the circuit.

BACKGROUND ART

Currently, in the field of information processing and telecommunications, an improvement of communication traffics communicating high-capacity data using the optical technology is rapidly progressing, and there have been developed optical fiber networks such as a backbone, Metro, and Access for long distances of a few kilometers and more. It would be effective in the future to use optical wirings for processing a large volume of data without delay for signal transmission between communication devices (over the distance from several meters to several hundreds meters), and even for communications over an extremely short distance (in the range from several centimeters to several tens meters) within a device.

When an optical wiring is used for communication within a device such as, for instance, a router/switch device, high-frequency signals transmitted from external networks such as Ethernet via an optical-fiber is input to a Line card. Multiple sheets of line cards are used for each backplane. The signals input to each of the line cards are concentrated on switch cards via the backplane, processed by an LSI (large scale integration) included in the switch card, and are output to each line card via the backplane. Conventionally, the signals of 300 Gigabits per second have been concentrated on the switch card via the backplane. To transmit the signals through the conventional electrical wiring, segmentation of the signals into about one to three Gigabits per second for each wiring is required, because of a propagation loss, and thus, 100 and more wirings are required.

Furthermore, the high-frequency lines need a waveform shaping circuit and require countermeasures against such problems as reflection and crosstalk between the wirings. Because there is the tendency for growth in system capacity, it is anticipated that the problems including increase of the number of wirings and crosstalk between wirings will become more serious in a device using the conventional electric wirings for processing a large volume of information at a processing speed of T bit/s or more. As a solution for the problems, it is effective to replace the conventional signal transmission lines between the line cards, the backplane, and the switch card with the optical technology. With the optical technology, the high-frequency signals of 10 Gigabits and more can be propagated with a reduced loss, and a less number of wirings are required with the necessity for countermeasures against the high-frequency signals eliminated, and therefore the optical technology is very promising.

To realize the high-capacity optical interconnection circuit as described above, it is necessary to develop an easy-to-manufacture integrated circuit board which allows for high density integration of optical wirings and optical coupling with a low loss. For the high density integration of wirings, it is effective to laminate a number of optical wiring layers such as optical waveguide arrays two-dimensionally arranged in the thickness direction of the substrate and optically connect the optical wiring layers to a surface light-emitting (or receiving) type photonic device array, because integration of wiring at a higher density is possible with a smaller mounting area in this configuration.

An example of the implementation as described above in which multiple optical wiring layers and photonic device arrays can be optically connected to each other with a low loss is disclosed in Patent Document 1. As illustrated in FIG. 1 of Patent Document 1, the example includes an arrayed optical waveguide unit for optically coupling each of the multiple wiring layers to the photonic device array, so that the light from the optical wiring layer is transferred via a core of the optical waveguide for optical coupling and thus a reduction in efficiency of the optical coupling caused by a beam spread is avoided.

Furthermore, Patent Document 2 describes another example which suppresses a reduction in efficiency of the optical coupling caused by a beam spread. As illustrated in FIG. 1 of Patent Document 2, in the example, a light beam going out from a light-emitting device is collimated by mounting a micro-lens in each of the multi-layer optical waveguide and the light-emitting elemental device, and furthermore the light beam is collected by the micro-lens and is introduced into the core of the optical waveguide. In this example, a radiation loss caused by the beam spread from the optical device is suppressed to avoid reduction in the efficiency in the optical coupling.

Patent Document 1: JP-A-2003-114365
Patent Document 2: JP-A-2001-185752

DISCLOSURE OF THE INVENTION

Problems to be Solved by the Invention

In the beam conversion device disclosed in Patent Document 1, however, the arrayed optical waveguide unit for optical coupling must be prepared independently from the main body unit. Furthermore, in response to the number of laminated arrayed optical waveguide units, optical waveguide units each having a different length are required for optical coupling, and therefore the number of required parts and the number of manufacturing steps disadvantageously increase. Furthermore, when preparing each arrayed optical wavelength unit, positioning is difficult, and an optical loss may becomes larger due to positional displacement of a light axis of an optical device from that of each optical waveguide. The influence becomes more remarkable when the number of laminated optical waveguide units increases, and therefore there is a limit in increasing the number of optical waveguide units laminated.

The approach disclosed in Patent Document 2 also increases the number of components and the processes for manufacturing, because a distance between a light-emitting optical device array and a core of the optical waveguide differs depending on the number of the laminated optical waveguide units in the laminated structure, and thus each layer requires a lens having a different focal length, namely a different non-spherical surface form, which also increases the number of components and processes for manufacturing. Also, the positioning between the layers is difficult, and the optical loss may increase because of positional displacement of an light axis between the optical device and each waveguide layer.

Therefore, an object of the present invention is to provide an optoelectronic integrated circuit board and a device using the board which, for optical connection between a multi-layer optical waveguide prepared on the board and a photonic device or an optical waveguide array connector, reduces eradiation caused by the beam spread, reduces lowering of optical coupling performance caused by positional displacement of a light axis between an optical device and each waveguide layer due to positional displacement between the layers when preparing the multilayered optical waveguide unit, enables high density integration of optical wiring, reduces a number of components and manufacturing processes, and furthermore enables cost reduction.

Means for Solving the Problems

To solve the problems described above, in the present invention, a mirror which changes a light path by an angle of 90 degrees is provided in each core having a high refraction index at an appropriate position corresponding to an optical device for transfer of a light beam in each layer of the multilayered optical waveguide unit. More specifically, the light path of an outgoing light from a light-emitting optical device arranged on a top surface of the multilayered optical waveguide unit is changed by 90 degrees by a mirror arranged in the core of the optical waveguide, and then the light beam propagates through the core. The propagated light, after the light path is changed by 90 degrees by a mirror arranged at another position in the core of the optical waveguide, propagates toward a top surface of the multilayered optical waveguide unit, and is received by an optical device arranged on the top surface of the multilayered optical waveguide unit arranged at the position, such as a surface illuminating photo detector. In the present invention, spread of a light beam is suppressed by having a light beam propagating to a second and the subsequent optical waveguide layers from the uppermost layer in the multilayered optical waveguide unit and passing through a core provided in the upper layer to prevent lowering of the optical coupling efficiency. In this configuration, a core provided in the propagation path of the light beams from the second or other optical waveguide is separated from other core areas, so that the effect of suppressing spread of a light beam is further improved. In addition, by designing the separated and isolated isolation core so that a light beam passing through the core is focused, the beam spread suppression effect can further be enhanced.

EFFECTS OF THE INVENTION

The present invention enables highly accurate positioning of an optical device arranged on the top surface of the multilayered optical waveguide unit by positioning of a mirror arranged in the core having a high refractive index provided in an optical waveguide. Furthermore, light propagated to the second and subsequent optical waveguide layers is from an upper optical waveguide via a core having a high refractive index provided in the upper optical waveguide layer, so that spread of the light beam is suppressed with lowering of the optical coupling efficiency prevented, and furthermore a light path of a light beam propagating through the core is changed and guided to an optical device provided on a top surface of the board, so that a required space can be ensured between the optical devices, which allows for high density integration of optical wirings and prevention of cross talk between the wirings. Furthermore, the present invention advantageously provides an optoelectronic integrated circuit board which allows for reduction of required components and manufacturing processes and also enables cost reduction.

BEST MODE FOR CARRYING OUT THE INVENTION

First Embodiment

Figure 1:
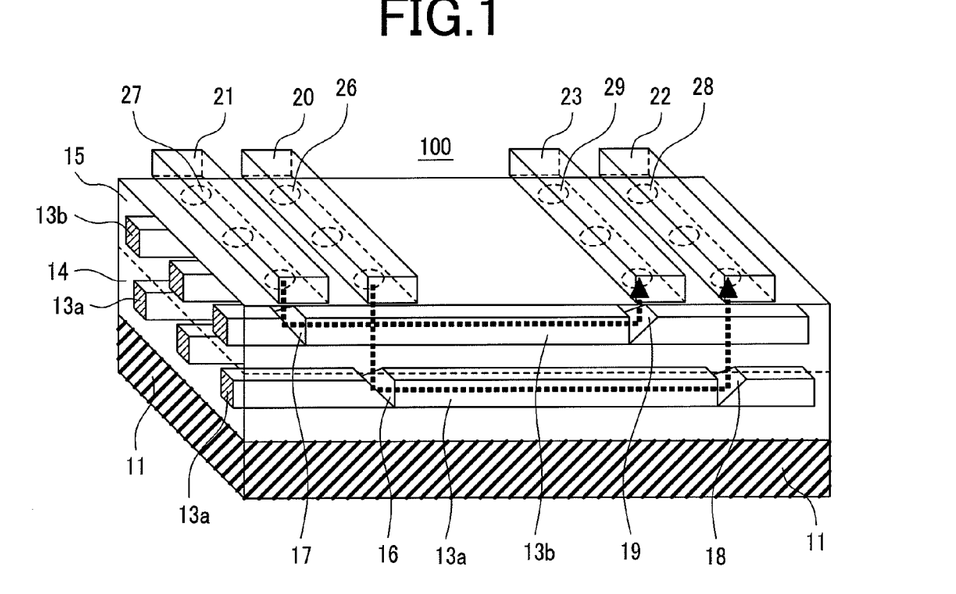
FIG. 1 is a perspective view illustrating an optoelectronic integrated circuit board according to a first embodiment of the present invention.

FIG. 1 is a perspective view illustrating an optoelectronic integrated circuit board 100 according to a first embodiment of the present invention. A board 11 is prepared with glass epoxy, ceramics, and the like. A configuration of the board 11 is two-layered and includes a first optical waveguide layer 14 having a plurality of cores 13a each having a high refraction index and embedded by a cladding layer, and a second optical waveguide layer 15 formed on the first optical waveguide layer having a plurality of cores 13b each having a high refractive index and embedded by a cladding layer, the first and second optical waveguide layers arranged on the substrate 11. The core 13a and the core 13b are positioned at the same position in the vertical direction. Mirrors 16 and 18, and mirrors 17 and 19 are arranged in the cores 13a and 13b which are respectively included in the optical waveguide layers 14 and 15. As illustrated in the figure, reflection surfaces of the mirrors 16 and 18 included in the core 13a of the optical waveguide layer 14 are inverted to each other. Thus, a light path of a light beam introduced via the top surface of the board 100 into the mirror 16 is changed by 90 degrees and the light beam propagates through the core 13a and goes to the mirror 18. A light path of the light introduced into the mirror 18 is changed by 90 degrees and the light beam propagates toward the top surface of the board 100. The same optical mechanism is provided also in the mirrors 17 and 19 arranged in the cores 13b included in the optical waveguide layer 15. On the top surface of the board 100, at the positions corresponding to the mirrors 16 and 18 of the core 13a, optical device arrays 20 and 22 including the same number of light-emitting optical devices 26 and photo detectors 28 as the number of the cores 13a are arranged. The same number of optical device arrays 20 and 22 are provided also at the positions corresponding to the mirrors 17 and 19 on the top surface of the board 100. Patterns for electrical wiring required by each device array are arranged on the top surface of the board 100 (although not illustrated). The patterns are formed by the lithography technology like in the case of the cores 13a and 13b, and by adjusting the positions to the cores 13a and 13b. The patterns are then electrically connected to the light-emitting electrical device 26 and the light-receiving electrical device 28 provided at the prespecified positions.

An example of a size of the main portion of the optoelectronic integrated circuit board 100 illustrated in FIG. 1 is described below. On the cross sections of the cores 13a and the core 13b taken along the direction vertical to the longitudinal direction thereof, the surface area is 50 μm by 50 μm, a space between the cores 13a in the optical waveguide layer 14 and a space between the cores 13b in the optical waveguide layer 15 (a distance between centers of the cores) are 250 μm respectively, and the vertical thickness of the cladding layers in the optical waveguide layers 14 and 15 is 25 μm. A space between the cores in the vertical direction is 100 μm. The space between the cores 13a in the optical waveguide layer 14 and a space between the cores 13b in the optical waveguide layer 15 (a distance between centers of the cores) are set at the value of 250 μm for compliance to a current fiber pitch of the MT connectors and the like.

The cores 13a and 13b of the optical waveguide layer 14 and the optical waveguide layer 15 are prepared, as described below, by means of the lithography which enables an appropriate and relative positioning for implementing the core 13b immediately above the core 13a. Thus, a light beams output from the light-emitting device 26 of the optical device array 20 is propagated to the mirror 16 of the core 13a via the core 13b. Likewise, the light beam reflected by the mirror 18 is propagated to the photo detectors 28 of the optical device array 22 via the core 13b. As a result, for transfer of a light beam between the mirror 16 and the mirror 18 arranged in the core 13a positioned away from the optical devices 20 and 22 on the top surface of the board 100 and having a high refraction index, the beam spread is reduced and lowering of performance of an optical coupling caused by a radiation loss is avoided, because the light beam is propagated via the core 13b which is more reflective compared to the cladding layer around the core. The optical devices 26 and 28 are surface light-emitting laser diode or a surface illuminating photo detector which are appropriate for surface implementation using the flip-chip. What is described above is also applicable to the optical devices 27 and 29.

For positioning of mirrors in the cores 13a, 13b with optical devices arranged on a top surface of the circuit board 100, in the first embodiment, the optical devices can be positioned at prespecified positions on the wiring pattern in the state where the optical devices are placed on the wiring pattern formed on the top surface of the circuit board 100, so that the optical devices are arranged at the accurate positions.

FIG. 2A to FIG. 2G are views each illustrating an example of a processing sequence for configuring the optoelectronic integrated circuit board according to the first embodiment of the present invention illustrated in FIG. 1.

Figure 2A:
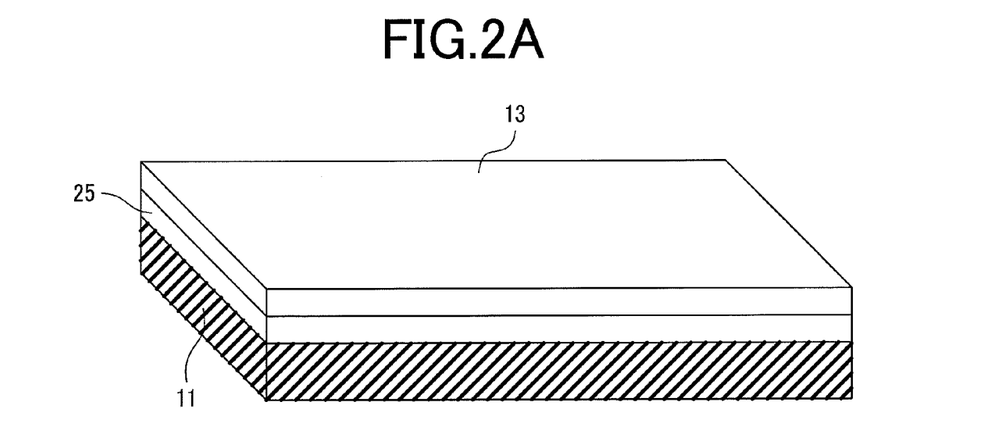
FIG. 2A is a view illustrating a state in which a cladding layer is formed on a substrate 11, and a layer of a material having a higher refraction index than that of the cladding layer for a first core is formed by coating or adhering.

FIG. 2A is a view illustrating a state in which a cladding layer 25 is prepared on the board 11 and a layer made of a material for the first core 13a having a high refraction index is formed by prepared by means of coating or adhering the material. The material for the cladding layer 25 as well as for the layer 13 may be a resin such as polymer or silica. It is to be noted that thickness of the cladding layer 25 is 30 µm and that of the layer 13 is 50 µm in response to the size described above.

Figure 2B:
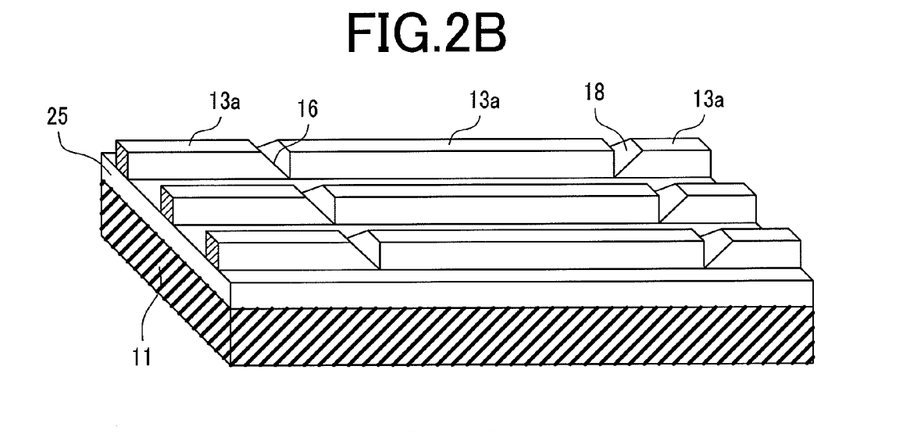

FIG. 2B is a view illustrating a state of the circuit board in a preparation process, in which a pattern is formed for the core 13a on the layer 13 on the top surface of the cladding layer 25 by means of the photolithography, etching or the like, and then mirrors 16 and 18 for changing a light path are formed at required positions by means of cutting, etching, or the like. Surfaces of the mirrors 16 and 18 are coated with a metal such as gold (Au) through evaporation, plating, and the like for enabling efficient reflection of the light.

Figure 2C:
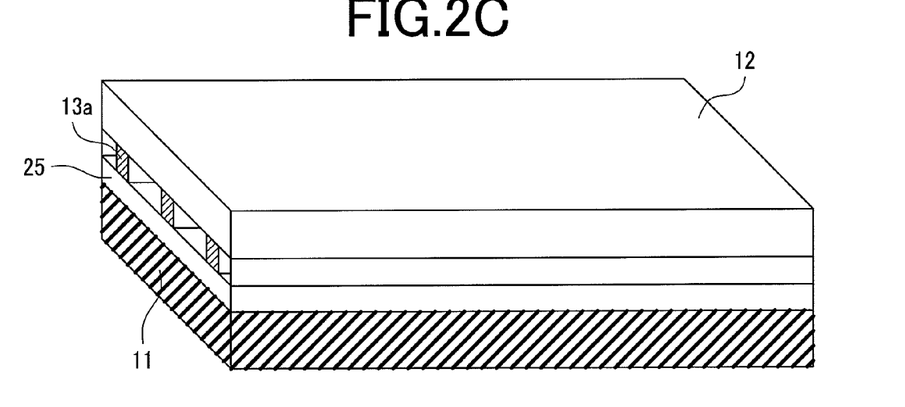
FIG. 2C is a view illustrating a state in which the same material for forming a cladding layer as that used for the cladding layer is placed on the core with the pattern formed thereon.

FIG. 2C is a view illustrating a state of the circuit board in a preparation process, in which the material 12 for the cladding layer made of the same material as that for the cladding layer 25 is mounted on the core 13a on which the pattern is formed. Thickness of the material 12 for the cladding layer is 80 µm. The whole circuit board is heated for softening the cladding layer 25 and the material 12 for the cladding layer, and then pressed with a push plate having a flat surface from the upper side, so that the material 12 for the cladding layer fills the spaces among the cores 13a and is integrated with the layer 25 placed on the substrate 11 so that an optical waveguide layer 14 in which the core 13a embedded by the cladding layer 25 is formed.

Figure 2D:
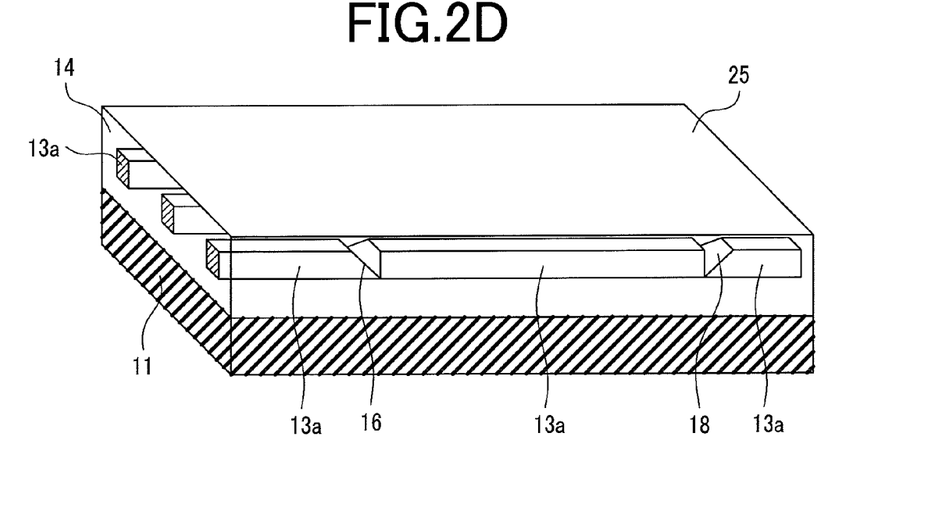
FIG. 2D is a view illustrating a state in which a first optical waveguide layer with the first core covered with the cladding layer is formed.

FIG. 2C is a view illustrating a state of the circuit board in a preparation process, in which the first optical waveguide layer 14 with the core 13a embedded by the cladding layer 25 is formed. In the view, only the mirrors 16, 18 are shown in the core 13a on the front surface for simplicity of the figure.

Figure 2E:
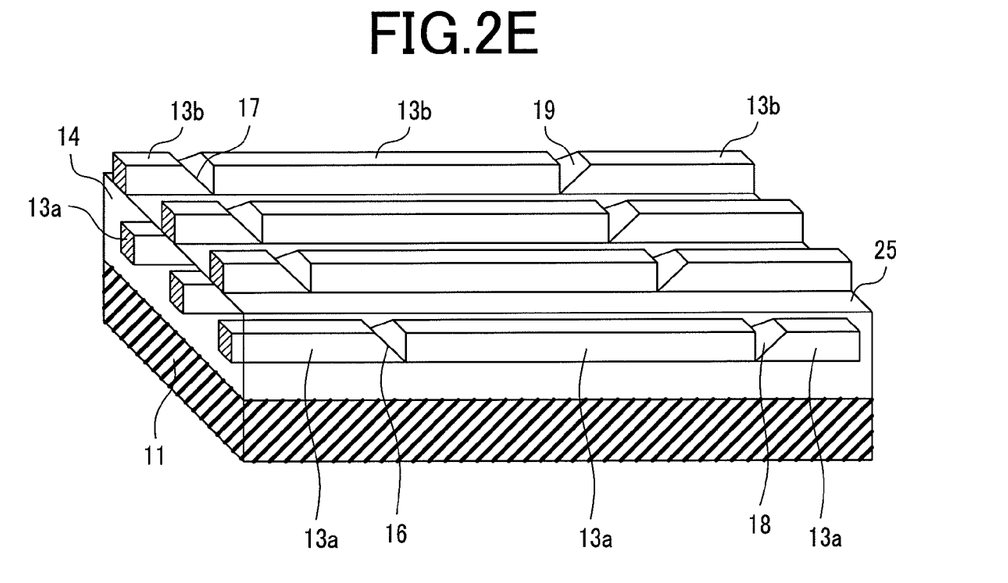
FIG. 2E is a view illustrating a state in which a layer of a material for a second core is laminated according to the same sequence as that described in relation to FIG. 2A and FIG. 2B on a top surface of the cladding layer in the first optical waveguide layer shown in FIG. 2D, a second core is patterned by photolithography, etching, or the like, and then a mirror for changing a light path is formed at a desired position.

FIG. 2E is a diagram illustrating a state of the circuit board in a preparation process, in which, on the cladding layer 25 of the optical waveguide layer 14 illustrated in FIG. 2D, by laminating a layer 13 made of a material for a second core 13b by means of the same process as described in FIG. 2A and FIG. 2B, a pattern is formed on the core 13b by means of the photolithography, etching or the like, and then mirrors 17 and 19 for changing a light path are formed at required positions. A distance between the mirrors 16 and 18 in the core 13a and a distance between the mirrors 17 and 19 in the core 13b are each preferably 250 µm in the longitudinal direction. This space is required for compliance to the current standard fiber pitch of the MT connectors. The reflection surfaces of the mirrors 17 and 19 for changing a light path are coated with a metal such as gold (Au) by means of vapor deposition, plating, and the like so that the light beam is reflected more efficiently.

Figure 2F:
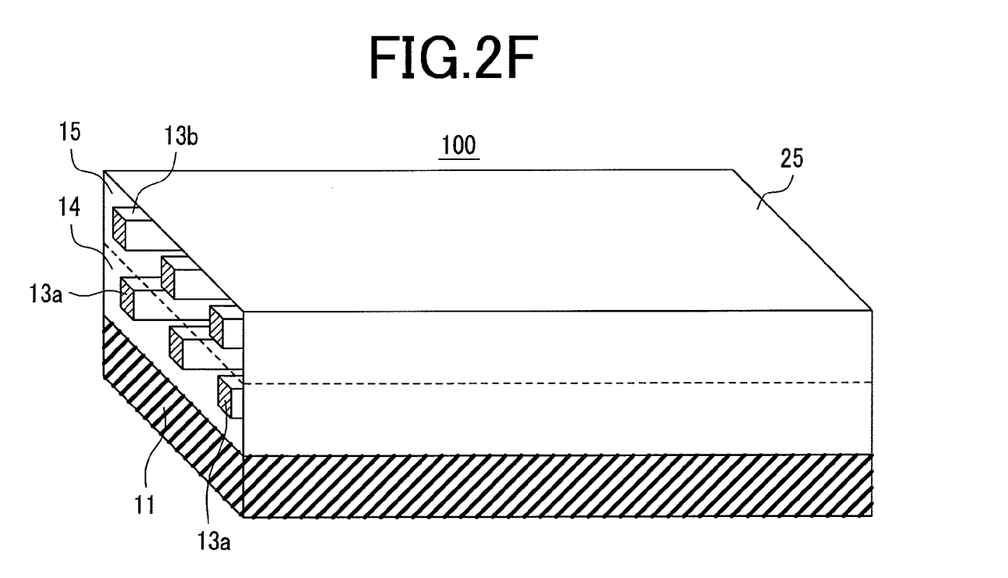
FIG. 2F is a view illustrating a state in which a second optical waveguide layer 15 with the second core embedded by the cladding layer is formed according to the sequence as that described in relation to FIG. 2C and FIG. 2D.

FIG. 2F is a view illustrating a state of the circuit board in a preparation process, in which a second optical waveguide layer 15 with the second core 13b embedded with the cladding layer 25 is formed by means of the same process as that described in relation to FIG. 2C and FIG. 2D. With the operations described above, the circuit board 100 having a two-layered core layer is formed, and in the circuit board 100, the first core 13a is formed in the first optical wave layer 14 and the second core 13b is formed in the second optical waveguide layer 15. With the processes described in relation to FIG. 2A to FIG. 2F, according to the processes described in FIG. 2A to FIG. 2F, a circuit board is provided, and a cross-sectional area of the core is 50 µm×50 µm, a space (a distance between centers of) between the first cores 13a in the first optical waveguide layer 14 and a space (a distance between centers of) between the second cores 13b in the second optical waveguide layer 14 are 250 µm respectively, and thickness of the cladding layers in the first and second optical waveguide layers 14 and 14 are 25 µm respectively. Therefore, the circuit board 100, in which thickness of each optical waveguide layer in the vertical direction is 100 µm, is formed.

Figure 2G:
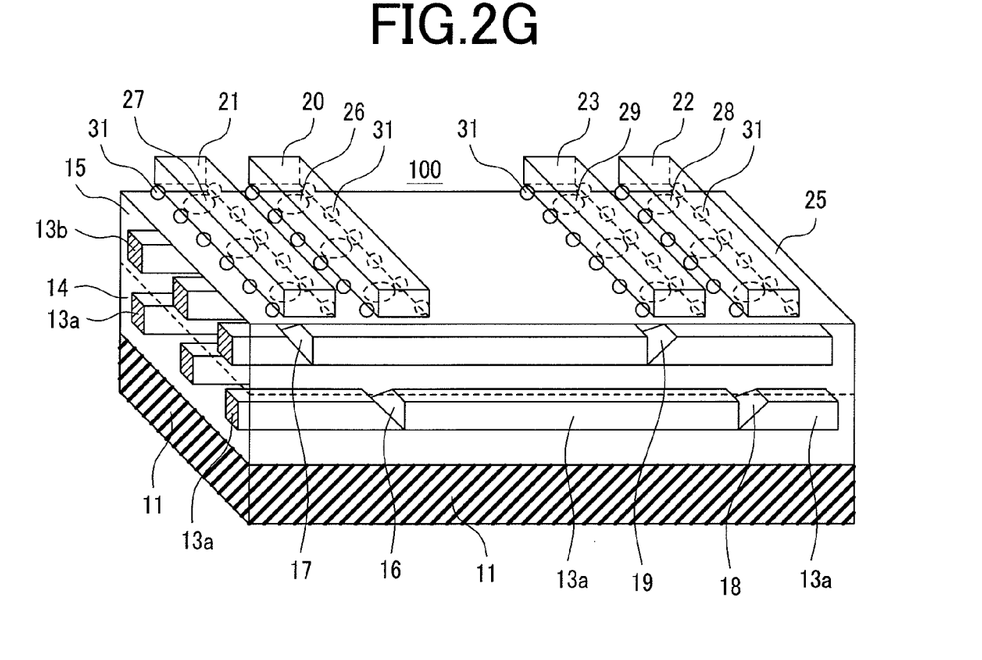
FIG. 2G is a view illustrating a final stage of manufacturing or the optoelectronic integrated circuit board shown in FIG. 1.

FIG. 2G is a view illustrating a final process for preparing the optoelectronic integrated circuit board 100 illustrated in FIG. 1. On the top surface of the cladding layer 25, electrical wiring patterns required by each of the device arrays 20, 21, 22, and 23 are formed by the lithography as is the case with the core 13a and the core 13b, and by adjusting the positions to the core 13a and the core 13b. At a pre-defined position on the wiring pattern, a solder bump 31 and each of the optical devices are arranged, and then the optical devices 20, 21, 22, and 23 are electrically connected to the light-emitting optical device 26 and the photo detector 28. With this operation, the optoelectronic integrated circuit board 100 illustrated in FIG. 1 is completed.

Figure 3:
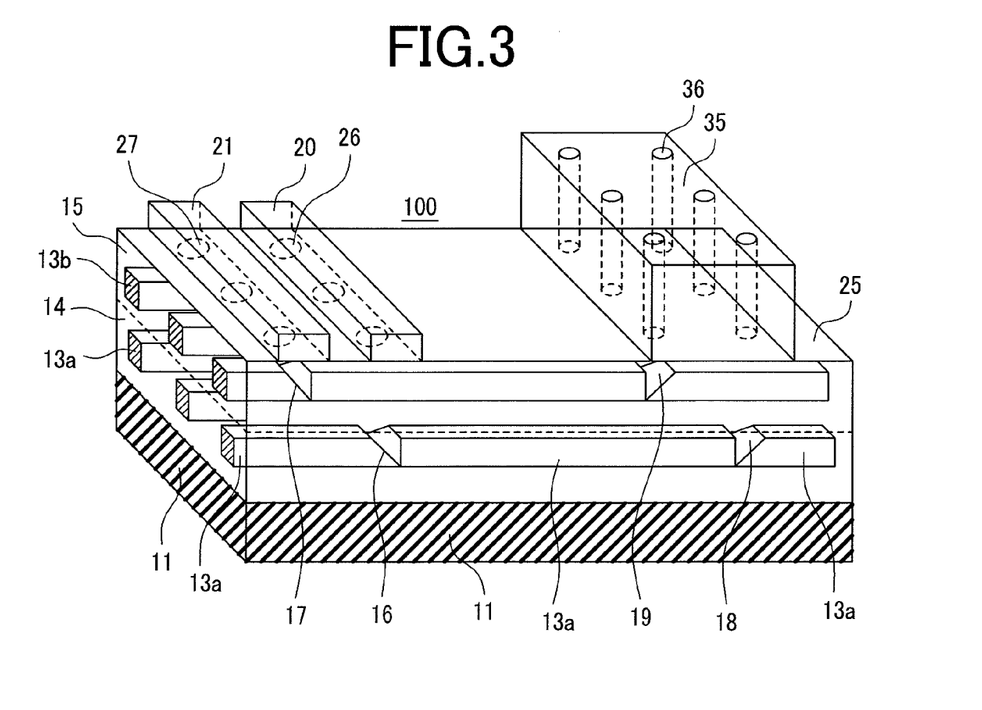
FIG. 3 is a perspective view illustrating an example in which an optical connector is provided in place of an optical device array on a top surface of an optoelectronic integrated circuit board.

FIG. 3 is a perspective view illustrating an example in which an optical connector 35 is arranged instead of the optical device arrays 22 and 23 on the top surface of the optoelectronic integrated circuit board 100. The reference numeral 36 denotes an optical fiber provided at the position where the illuminating devices 28 and 29 are originally arranged. In the first embodiment of the present invention, the space between the mirrors 18 and 19 in the longitudinal direction is 250 µm, and the space between the cores 13a and 13b is 250 µm, and thus spaces between the optical fibers 36 in a direction between the cores and in the longitudinal direction of the core are also 250 µm, so that the standard MT connector can be applied. When the optical connector 35 is arranged on the top surface of the cladding layer 25, based on the process in which, similarly to the core 13a and the core 13b, the electrical wiring pattern is formed on the top surface of the cladding layer 25 through the lithography technology, the positioning of the optical connector 35 is indicated while adjusting the positioning to the core 13a and the core 13b. Therefore, the optical connector 35 can be arranged without positional displacement. In the process, the top surface of the cladding layer 25 and a face of the optical connector 35 touching the layer 25 may be fixed by a concavity and convexity engagement. The fixation enables a simple and highly accurate adjustment of positioning of the optical connector 35 and the mirrors in the Optical waveguide layers.

Second Embodiment

Figure 4:
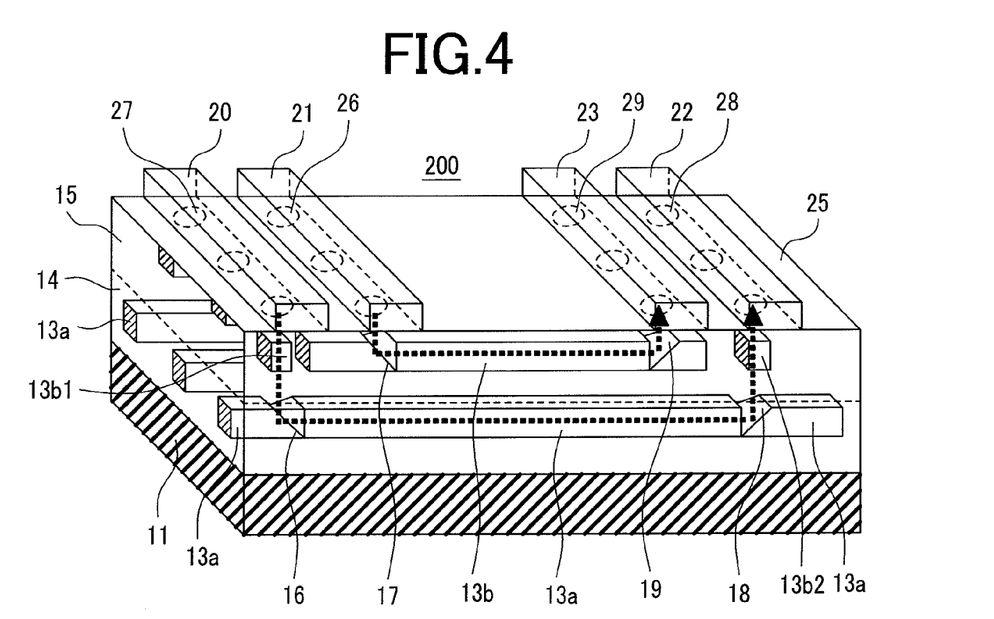
FIG. 4 is a perspective view illustrating an optoelectronic integrated circuit board according to a second embodiment of the present invention.

FIG. 4 is a perspective view illustrating an optoelectronic integrated circuit board 200 according to a second embodiment of the present invention. In the optoelectronic integrated circuit board 200, different from the optoelectronic integrated circuit board 100, the mirrors 16, 18 of the core 13a located at a position further from a top surface of the optoelectronic integrated circuit board 200 and the core 13b through which light passes when transmitted and received to and from an optical device on the top surface of the optoelectronic integrated circuit board 200 are separated and isolated from each other in each light path. Because of the configuration, propagated light in the vertical direction is more tightly blocked in the separated and isolated isolation cores 13b1, 13b2, which enables realization of highly efficient optical coupling performance. Also in this embodiment, a path of light propagated through the cores 13a, 13b is represented by a broken line like in FIG. 1.

As clearly understood by comparing FIG. 4 with FIG. 1, in the optoelectronic integrated circuit board 200, the mirrors 16, 18 of the lower core 13a and the cores 13b1, 13b2 which light passes through when transmitted and received to and from an optical device on a top surface of the optoelectronic integrated circuit board 200 are separated and isolated in each light path. Because of this configuration, to prevent propagation of light through the core 13b between the mirror 17 and the mirror 18 from being impeded, the mirror 17 of the core 13b is positioned in the inner side from the mirror 16 of the core 13a. In relation to the position of the mirror 17, also the optical device arrays 20, 21 are positioned with the contrary positional relation. Furthermore, the outer sides of the mirrors 17 and 19 in the core 13b are cut off, and separated and isolated isolation cores 13b1 and 13b2 embedded by a cladding layer are formed. The processing for forming the configuration described above can be performed by means of the patterning employed for patterning of the core 13a described in related to FIG. 2B and FIG. 2E. The separated and isolated isolation cores 13b1 and 13b2 are naturally located at positions aligned with the light path between the mirrors 16, 18 in the core 13a and an optical device located on a top surface of the optoelectronic integrated circuit board 200.

Because a peripheral surface of a light path to and from an optical device located on a top surface of the optoelectronic integrated circuit board 200 is embedded by a cladding layer made of a material having a lower refraction index as compared to that of optical waveguide layer, the isolated isolation cores 13b1, 13b2 can block propagated light in the vertical direction in the core area more tightly as compared to a case in which light passes through the optical waveguide layer 13b, which enables realization of highly efficient optical coupling performance. Furthermore, the rectangular core structure can be realized only by changing a layout of the patterning for the core 13a and the patterning for the core 13b described in relation to FIG. 2B and FIG. 2E, and therefore it is not necessary to add any additional parts nor additional process.

In the embodiment shown in FIG. 4, the isolated isolation cores 13b1, 13b2 have a rectangular form and are isolated respectively, but FIG. 5(A) shows an example of a tapered and isolated core formed by cutting off a tip portion of a square pyramid or a cone. Other components are the same as those in the example shown in FIG. 4. For the purpose of simplification, only the board 11, the cores 13a, 13b, and isolated isolation cores 13b1, 13b2 are shown with hatching in the cross-sectional view shown in FIG. 5(A). FIG. 5(B) and FIG. 5(C) are enlarged perspective views each illustrating the isolated isolation core 13b1. The isolated isolation core 13b2 is arranged with the inverted positional relation with the isolation core 13b1. As described above, because the isolated isolation cores 13b1 and 13b2 have an isolated and petrous structure, the cores 13b1 and 13b2 can reflect and send out light coming in from an end face on a side face of the tapered and isolated core from an end face in the contrary side in the focused state. Because of the feature, light propagating through the isolated isolation cores 13b1 and 13b2 is blocked in more tightly as compared to an insolated rectangular form, and even when the light leaks outs from the isolated isolation cores 13b1, 13bw, the light is refracted with extension of the light beam suppressed, which enables realization of highly efficient optical coupling performance. In addition, because a diameter of a light beam going out from the core can be focused more as compared to that when coming into the core, the light beam can be introduced onto a surface of the mirror section 17 more efficiently, which substantially reduce the light coupling loss due to displacement between centers of light axes of the core 41 and the mirror 17. A structure of the core 41 can be formed by the techniques such as cutting or etching often used for preparing a light path conversion mirror, but the laser beam irradiation system is most effective, because a form inclining at a desired angle can be formed at a desired position by the laser beam irradiation system.

Figure 6:
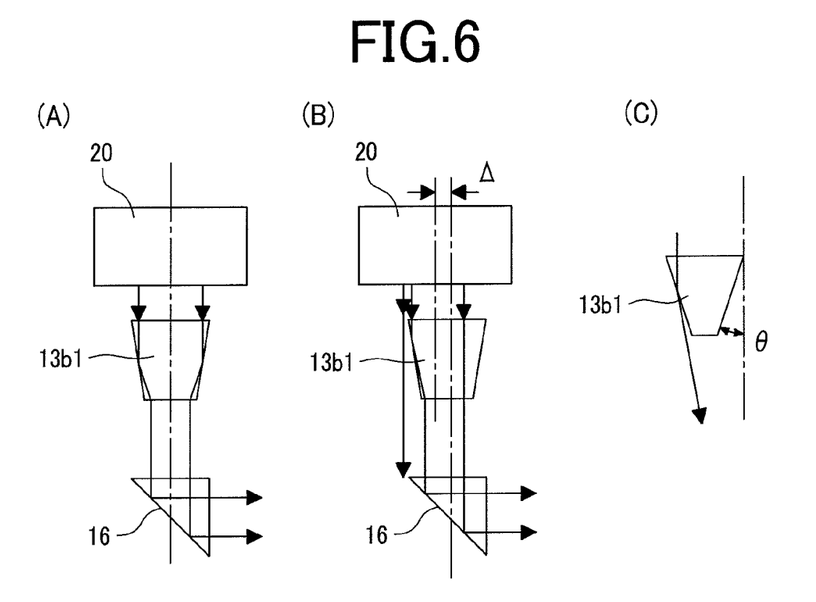
FIGS. 6(A), 6(B), and 6(C) are conceptual views each schematically illustrating the effect acquired by providing an isolated isolation core.

FIGS. 6(A), 6(B), and 6(C) are conceptual views each schematically illustrating the effect obtained by arranging the isolated isolation cores 13b1, 13b2 as tapered isolated cores. In the figures, only the optical device array 20, the isolated isolation core 13b1, and the mirror 16 are shown. In FIG. 6(A), central positions of the components are aligned as represented by a dashed line, while, in FIG. 6(B), only the array 20 is displaced by Δ. FIG. 6(C) is a view illustrating an angle θ between a side face and an axis when the isolated isolation cores 13b1, 13b2 are tapered and isolated ones.

In FIG. 6(A), the line extending from the optical device 20 toward the isolated isolation core 13b1 represents an outer edge of a light beam going out from a light emitting optical device in the optical device array 20. When this light beam hits a side face of the isolated isolation core 13b1, the light beam is refracted and goes toward an inner surface of the isolated isolation core 13b1, goes out from an end face of the isolated isolation core 13b1, is reflected on the mirror 16, and goes though the core. Namely, a diameter of a light beam can be made smaller than that when incoming by the isolated isolation core 13b1, and thus extension of the light beam can be suppressed. In FIG. 6(B), a light axis of the optical device array 20 is displaced by Δ from light axes of the isolated isolation core 13b1 and the mirror 16, so that a portion of the light emitted from the light-emitting optical device is not introduced to the isolated isolation core 13b1. Therefore, the light coupling loss increases. As shown in FIG. 6(C), a side face and an axis of each of the isolated isolation core 13b1, and the isolated isolation core 13b2 forms an angle θ. When the angle θ is in the range from 5 to 10° C., an excellent result is provided. When this angle θ is made larger, the focusing effect becomes more remarkable, and the angle may be around 30 degrees. In this case, the light emitted from the light-emitting optical device is refracted on the side face, and the light axis is bent, so that all of the emitted light is not lost.

Third Embodiment

Figure 7:
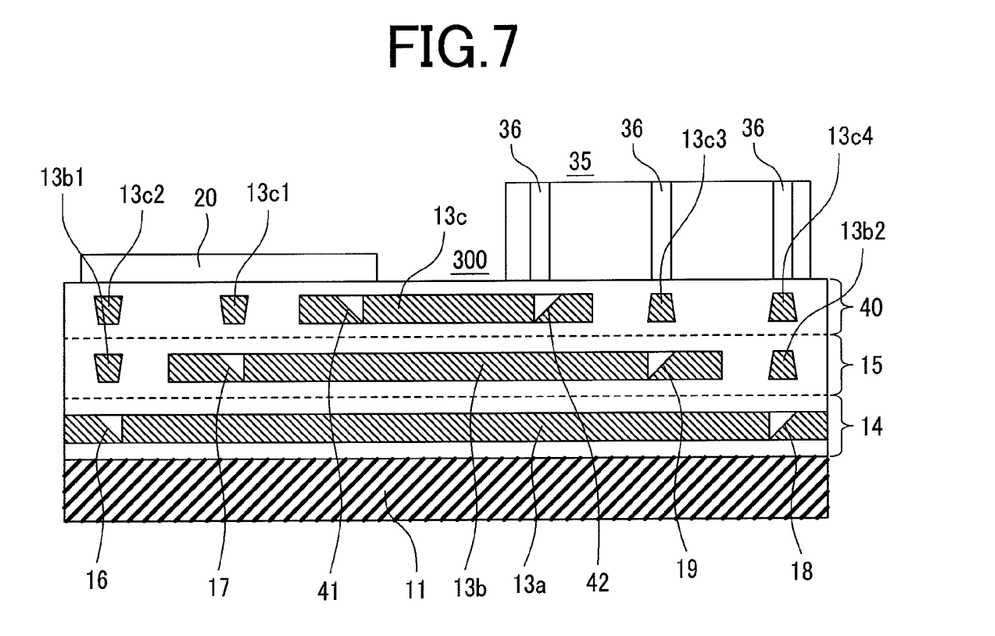
FIG. 7 is a cross-sectional view of an optoelectronic integrated circuit board according to a third embodiment of the present invention.

FIG. 7 is a cross-sectional view illustrating a optoelectronic integrated circuit board 300 according to a third embodiment of the present invention. In the example shown in FIG. 7, a two-layered optical waveguide comprising a first optical waveguide 14 and a second optical waveguide 15 is laminated on a substrate 11 like in the first and second embodiments described above, and then a third optical waveguide 40 is laminated on the two-layered optical waveguide by the same technique as described in relation to FIG. 2E, and FIG. 2F. In the third optical waveguide layer 40, a core 13*c*, mirrors 41 and 42, a tapered isolated cores 13*c*1, 13*c*2, 13*c*3 and 13*c*4 each separated from the core 13*c* are formed. These components can be formed by the same technique as that employed for preparing the tapered and isolated cores 13*b*1 and 13*bs* separated from the core 13 in the second optical waveguide. The mirror 16 in the optical waveguide layer 40, the separated and isolated tapered core 13*b*1 of the optical waveguide layer 15, and the separated and isolated tapered core 13*bc* of the optical waveguide layer 40 are aligned on the same light axis. Also the mirror 18 in the optical waveguide layer 14, the separated and isolated tapered core 13*b*2 in the optical waveguide layer 15, and the separated and isolated tapered core 13*c*4 in the optical waveguide 40 are aligned on the sane light axis. Furthermore also the mirror 17 in the optical waveguide layer 15, the separated and isolated tapered core 13*c*1 in the optical waveguide layer 40, the mirror 19 in the optical waveguide layer 15, and the separated and isolated tapered core 13*c*3 in the optical waveguide 40 are also aligned on the same light axis. An optical device array comprising light-emitting optical devices aligned on each light axis is provided on a top surface of the optoelectronic integrated circuit board 300, and an optical connector 35 comprising optical fibers 36 arranged two-dimensionally is provided on each light axis.

In the third embodiment, the core 13*a* in the optical waveguide layer 14 propagates an optical signal propagated through the two optical waveguide layers 15 and 40. However, the light from the optical device is propagated through the separated and isolated tapered cores 13*c*2, 13*b*1, so that the optical signal can be transmitted and received with low loss. Therefore, density of an optoelectronic integrated circuit board can be made higher.

Fourth Embodiment

Figure 5:
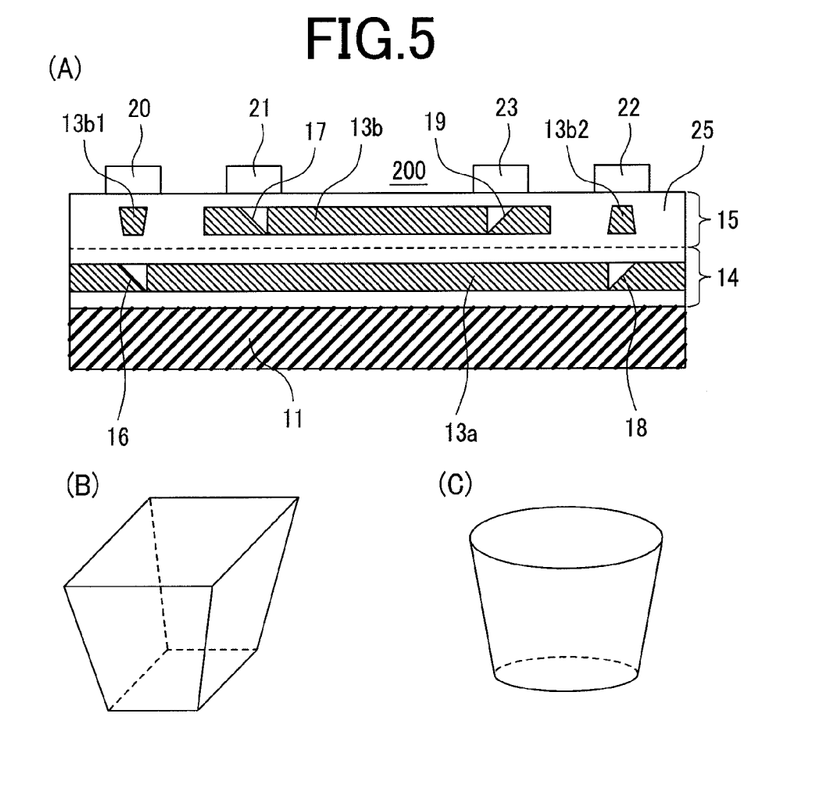
FIG. 5(A) is a view illustrating an example in which, different from the example shown in FIG. 4 in which the isolated isolation cores 13b1, 13b2 each have a rectangular form and are isolated from each other, an isolated tapered core prepared by cutting off a tip portion of a square pyramid or a cone is provided.
FIGS. 5(B) and 5(C) are enlarged views of the isolated isolation cores.
Figure 8:
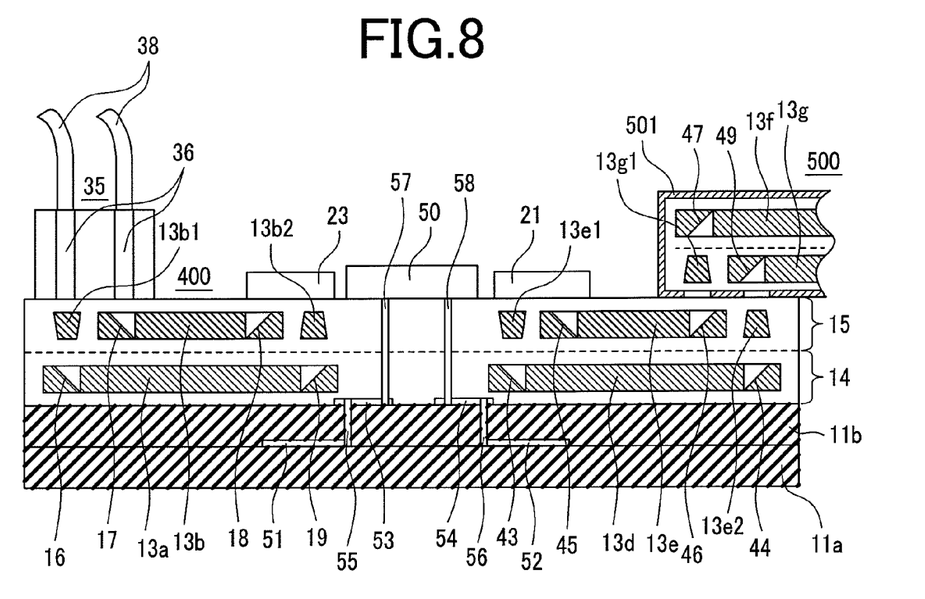
FIG. 8 is a cross-sectional view of an optoelectronic integrated circuit board according to a fourth embodiment of the present invention.

FIG. 4 is a cross-sectional view illustrating an optoelectronic integrated circuit board 400 according to a fourth embodiment of the present invention. In the fourth embodiment, the board is configured with the so-called multilayered printed board. A board 11*a* with electric wirings 51, 52 provided at a central portion of the surface and a board 11*b* with electric wirings 53, 54 provided at a central portion of the surface are laminated at a central portion of the surface of the board 400. The electric wirings 51, 52 are connected with the electric wirings 53, 54 through electric wirings 55, 56 provided in through holes, respectively, if required. The optical waveguide layers 14, 15 each having the configuration according to the second embodiment described in relation to FIG. 5 are formed on a top surface of the board 11*b*. The optical waveguide layers according to the embodiment described above are formed on this board. In the fourth embodiment, the cores 13*a*, 13*b*, the mirrors 16 to 19, and the separated and isolated tapered cores 13*b*1, 13*b*2 are formed in the left halves of the optical waveguide layers 14, 15 respectively, and the corresponding cores 13*d*, 13*e*, the mirrors 43 to 46, and the separated and isolated tapered cores 13*e*1, 13*e*2 are formed in the right halves of the layers 14, 15 respectively.

The optical connector 35 is provided at a left edge portion of a top surface of the optical waveguide layer 15, and fibers 36 of a fiber array 38 are provided at positions opposite to the separated and isolated tapered core 13*b*1 and the mirror 17. On the other hand, the optical device array 23 having photo detectors opposite to the separated and isolated tapered core 13*b*2 and the mirror 18 are provided at position closer to a central portion of the top surface of the optical waveguide layer 15. An integrated circuit (LSI) 50 is provided at a center of the top surface of the optical waveguide layer 15. An optical device array having photo detectors is provided in the contrary side from the optical device array 23 on the top surface of the optical waveguide layer 15. The optical device arrays 23, the integrated circuit (LSI) 50, and the optical device array 21 are electrically connected to the electric wiring pattern provided on the top surface of the optical waveguide layer 15, and also are connected via electric wirings 57, 58 through a through-hole formed by making use of an area with the cores 13*a*, 13*b*, 13*d*, and 13*e* of the optical waveguide layers 14, 15 not provided therein to the electric wirings 53, 54. A light-emitting surface of the light-emitting optical device provided in the optical device array 23 faces the separated and isolated tapered core 13*e*1 and the mirror 45.

On the other hand, a optical waveguide array connector 500 is provided at a right end portion of the top surface of the optical waveguide layer 15. The optical waveguide array connector 500 has a optical waveguide layer including a core 13*f* and a core 13*g*. The core 13*f* has a mirror 47 provided at one end portion thereof, while the core 13*g* has a mirror 49 and a separated and isolated papered core 13*g*1. A mirror 46 provided at another end portion of the core 13*e* of the board 400 and the separated and isolated tapered core 13*e*2 face the separated and isolated core 13*g*1 of the core 13*g* of the optical waveguide array connector 500 and the mirror 49 respectively. An external surface of the optical waveguide layer of the optical waveguide array connector 500 is covered with and protected by a cover layer 501. In the portion where light is exchanged with cores of the optoelectronic integrated circuit board 400, the cover layer 501 is opened so that light can pass through the portion.

With the configuration according to the forth embodiment, an optical signal introduced from the fiber 36 into the optoelectronic integrated circuit board 400 is converted to an electric signal via the cores 13*a*, 13*b* by the photo detectors of the optical device array 23, and is introduced into the integrated circuit (LSI) 50, where the electric signal is subjected to necessary signal processing. The electric signal having been subjected to the signal processing in the integrated circuit (LSI) 50 is converted to an optical signal by a light-emitting optical device of the optical device array 21, transferred via the cores 13*d*, 13*e* and also via the cores 13*g* and 13*f* in the board 500 to another optoelectronic integrated circuit board. AS described above, when a signal is transmitted to or received from an optical device on a circuit board. transfer of an optical signal is performed at least twice between an optical device and a code on the circuit board, but the signal transfer is performed via a separated and isolated tapered cores, so that optical coupling can be realized with a low loss not negatively affecting the transfer performance.

(Example of a Quantitative Assessment of the Effect Provided by the Present Invention)

Figure 9:
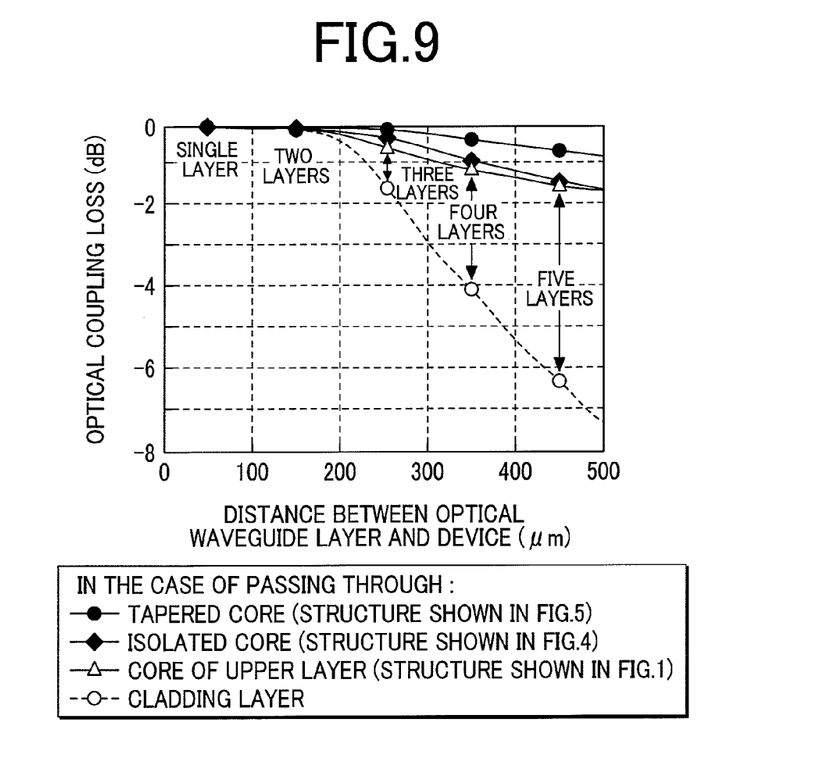
FIG. 9 is a view illustrating a result of computing for an optical coupling loss between an optical device arranged on an optoelectronic integrated circuit board and a core of a optical waveguide layer transmitting and receiving optical signals to and from the optical device by means of the light beam tracking method.

FIG. 9 is a view illustrating a result of computing a loss in optical coupling between an optical device provided on a optoelectronic integrated circuit board and a core of a optical waveguide layer transmitting or receiving an optical signal to and from the optical device by means of the light beam tracking method. In the case shown in FIG. 9, the optical device is a light-emitting optical device with the beam spreading angle of 23 degrees, the optical waveguide layer has a core/clad specific refraction index of 1%, the core has a cross section of 50 μm×50 μm as described above, and a thickness of the clad embedding the core is 25 μm. Therefore, a space between core centers in each optical waveguide layer is 100 μm, and a distance between an upper edge of the uppermost optical waveguide layer and a light-emitting surface of the optical device provided on the board is 50 μm.

FIG. 9 is a graph plotted with a distance between an optical device and a core along the horizontal axis and with an optical coupling loss along the vertical axis. In the figure, the dotted line with open circles thereon represents an optical coupling loss between an optical device and a core of the lowermost optical waveguide layer when a propagated light between the optical device and the core passes only a cladding layer; a solid line with triangles thereon represents the optical coupling loss when the propagated light between the optical device and the core passes a core in the upper layer; a solid line with filled squares represents the coupling loss when the propagated light between the optical device and the core passes a separated and isolated isolation core in the upper layer; and a line with filled circles thereon represent the coupling loss when the propagated light between the optical device and the core passes through the separated and isolated tapered core in the upper layer. Therefore, the expression of "single-layered" as used herein means that there is only one optical waveguide layer, while the expression of "two-layered" means that there are two optical waveguide layers. A form of the separated and isolated isolation core is rectangular or as shown in FIG. 5(B). Therefore, the expression of "four-layered" as used herein means the optical coupling loss when the fourth optical waveguide layer receives an optical signal from the optical device through three optical waveguide layers. As understood from the figure, when the optical waveguide layer is a single-layered one or a two-layered one, a distance between a core in the optical waveguide layer and an optical device is relatively small, for instance, 150 μm, and therefore there is substantially no loss due to spread of a light beam, and the effect provided by the present invention is not remarkable.

However, as the number of constituent layers in a optical waveguide layer increases, the distance to the optical device becomes larger, and when the propagated light represented by the broken line passes only a cladding layer, the loss due to the beam spread described above becomes larger. In contrast, when propagated light to the lower optical waveguide layer is passed through a core in the upper layer like in the structure according to the present invention which is represented by the solid line in the figure, even if the optical waveguide layer includes 5 constituent layers, the loss is not more than −1.6 dB (about 30%) in all of the embodiments. In contrast, when the propagated light is passed through only the cladding layer, the loss is not less than −6 dB (about 80%). The comparative data above indicates that the present invention is effective in suppression of beam spread and the effect provided by the present invention is visible.

In the example shown in FIG. 1, light propagating through the core 13b and light transmitted from the optical device 26 to the core 13a crosses each other, but the traveling directions are different by about 90 degrees, so that there is no possibility of performance deterioration due to interference between the two light beams. In addition, although FIG. 9 illustrates the characteristics of light transfer among a light-emitting optical device, a photo detector, and a core, the same result can be obtained also by using an optical connector between the light-emitting optical device and the photo detector.

Figure 10:
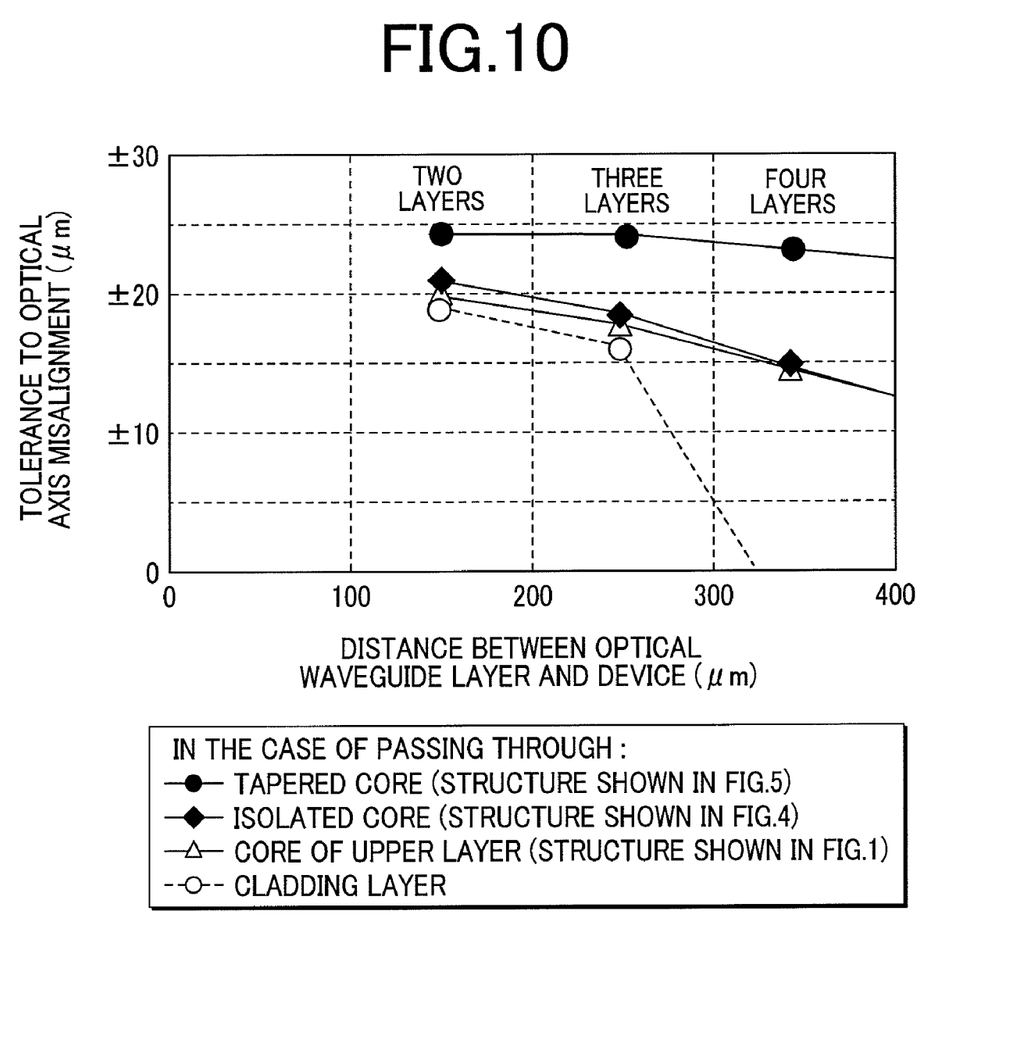
FIG. 10 is a view illustrating a result of computing for a relation between a tolerance (Δ in FIG. 6(B)) against positional displacement of a light axis when a separated and isolated isolation core is moved in a direction parallel to a substrate (in a direction parallel to a paper surface and a core-optical device distance.

FIG. 10 is a view plotted by using the same parameters as those in FIG. 9, and illustrates a result of computing for a relation between a tolerance for a positional displacement of a light axis (Δ in FIG. 6(B)) and a core to optical device distance when a separated and isolated isolation core is moved in a direction parallel to the board (in a direction parallel to the paper surface). The same result can be obtained also for a tolerance for a positional displacement of the light axis when the core is moved in the vertical direction (in a direction vertical to the paper surface), but illustration is omitted herein because the graphical expression becomes extremely complicated. A taper angle of the separated and isolated isolation core shown in FIG. 6(C) is 7 degrees. The tolerance for positional displacement is defined with a travel to a point where the loss is −2 dB for the maximum optical coupling efficiency. In the figure, the tolerance for positional displacement in movement of a core in a direction vertical to a board surface is shown. Furthermore, when propagated light passes through a cladding layer, a tolerance for positional displacement of a mirror is shown in place of a tolerance for positional displacement of a separated and isolated isolation core.

FIG. 10 shows the maximum tolerance for positional displacement of a separated and isolated isolation core in a case where light propagates between a core of the lowermost optical waveguide layer and an optical device. More specifically, the dotted line with open circles thereon represent the maximum tolerance when light propagating between the optical device and the core passes through only a cladding layer; the line with triangles thereon represent the maximum tolerance when the light propagating between the optical device and the core passes through a core in the upper optical waveguide layer; the line with filled squares thereon represent the maximum tolerance when the light propagating between the optical device and the core passes through a separated and isolated isolation core in the upper optical waveguide layer; and the line with filled circles thereon represent the maximum tolerance when the light propagating between the optical device and the core passes through a separated and isolated tapered core in the upper optical waveguide layer. When there is only one optical waveguide layer (single-layered), the light does not pass through a separated and isolated isolation core, and therefore a case of a single-layered structure is not shown in FIG. 9, and the figure illustrates data when there are two or more optical waveguide layers. Therefore, for instance, in the "four-layered" structure, the maximum tolerance for positional displacement means a tolerance for positional displacement of a separated and isolated isolation core when an optical signal from an optical device is received via three optical waveguide layers by the fourth optical waveguide layer. As understood from the figure, with the separated and isolated tapered core, the visible effect is provided irrespective of the number of optical waveguide layers. The maximum tolerance when light passes through a separated and isolated isolation core and a core in the upper layer is not substantially different from that when the light passes through a cladding layer in the case of two- or three-layered structure, but when there are four or more optical waveguide layers, the tolerance for positional displacement of a light axis of not less than 10 μm can be obtained, for instance, in a case of the four-layered structure, which indicates that the effect provided by the present invention is large.

From the result shown in FIG. 10, it is understood that, in a case where the propagated light represented by the dotted line passes through only a cladding layer, the more optical waveguide layers are laminated, the distance from the optical device becomes larger and the loss due to spread of a light beams becomes larger, and also that, when three or more layers are laminated, a tolerance for positional displacement of a light axis cannot be ensured among an optical device, a core, and a mirror. In contrast, in the structure represented by the broken line and described in the first embodiment, even when three layers are laminated, the tolerance for the positional displacement can be improved to not less than 20 μm by suppressing the optical coupling loss due to spread of a light beam and furthermore by providing a taper angle represented by the solid line to reduce a surface area of the core in the propagating direction of a light beam passing therethrough, because of the effect of narrowing a light beam diameter.

The optical coupling with any other optical device in the optoelectronic integrated circuit board according to the present invention is defined in the sense that a light beam is introduced once from a surface of the board and is reflected by a mirror to change the light path, and then is introduced into a core, or that a path of a light beam transferred through a core is changed by a mirror toward a surface of the board. Furthermore, a space between optical devices arranged on a surface of the board, for instance, between fibers can be set to a standard value for an MT connector, and therefore, even if a distance between cores in a direction in which optical waveguide layers are laminated is shortened, the cross talk never occurs, and therefore a distance between a core and an optical device arranged on a top surface of the optoelectronic integrated circuit board can be made smaller as shown in FIGS. 9 and FIG. 10.

Fifth Embodiment

Figure 11:
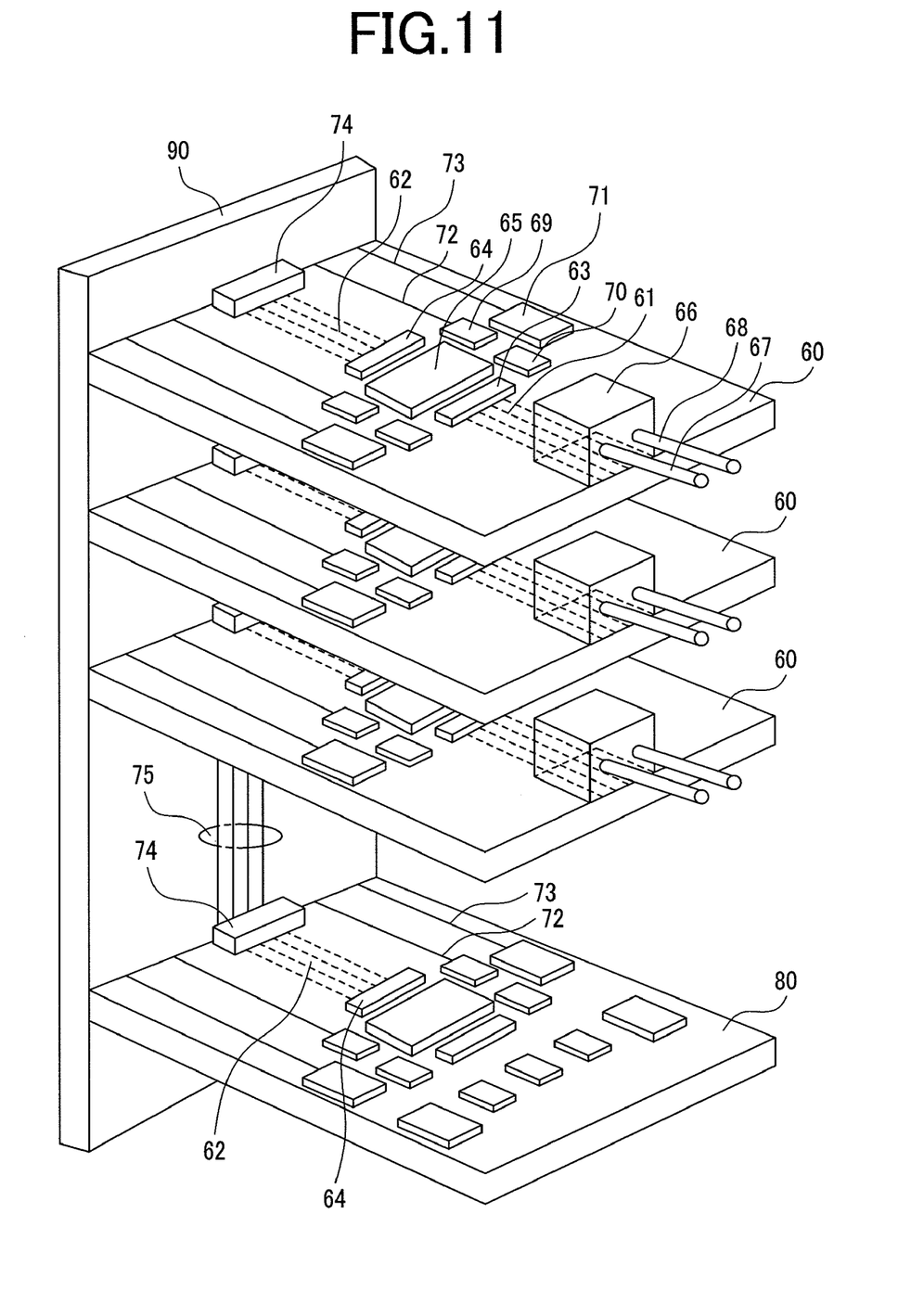
FIG. 11 is a perspective view illustrating an outline of an example in which the optoelectronic integrated circuit board according to the present invention is applied, namely an optical communication device in which the optoelectronic integrated circuit board according to the fourth embodiment shown in FIG. 8 is applied.

FIG. 11 is a view illustrating an outline of a fifth embodiment in which the optoelectronic integrated circuit board according to the present invention is applied, and is a perspective view illustrating an optical transmission device having a configuration in which the optoelectronic integrated circuit board 400 according to the fourth embodiment shown in FIG. 8 is applied. In FIG. 11, reference numeral 60 denotes an electric integrated circuit board, which is based on the optoelectronic integrated circuit board 400 described in relation to FIG. 8. Components 61, 62 represented by broken lines are embedded optical waveguide layers, which correspond to the optical waveguide layers 14, 15 including cores corresponding to the cores 13*a*, 13*b*, 13*d*, and 13*e*. Components 63, 64, and 65 correspond to the optical device arrays 23, 21, and the integrated circuit (LSI) 50 respectively. Components 66 and 67, 68 correspond to the optical connector 35 and the fiber array 38 respectively. Reference numerals 69, 70, and 71 each denote an electronic circuit. A reference numeral is not assigned to the electronic circuit in front of the integrated circuit (LSI) 50 for simplification. Reference numerals 72, 73 generically denote electric wirings, which are used for connection with electronic circuits in other electric integrated circuit board 60 as well as for connection with electronic circuits on a switch card 80 described below. Reference numeral 74 denotes an optical connector compatible with the optoelectronic integrated circuit board 500 shown in FIG. 8, and in the case shown in FIG. 11, the optical connector receives light beams from cores in the optical waveguide layers 14, 15 and transfers the light beams through optical fibers. The electric integrated circuit board 60 not only receives and processes an optical signal, but also is required to again transmit the processed optical signal. Another set of optical waveguide layers 61, 62 corresponding to the optical waveguide layers 14, 15 described in relation to FIG. 8 and optical device arrays 63, 64 is required for the transmission function, but description thereof is omitted herefrom.

Reference numeral 80 demotes a switch card. The switch card comprises an optical connector 74, an optical waveguide layer 62, an optical device array 64, electric wirings 72, 73, and an electronic circuit with no reference numeral assigned thereto.

Reference numeral 90 denotes a backplane, which mechanically supports the electric integrated circuit board 60 and comprises a fiber 75 for transferring an optical signal from the optical connector 74, and wiring (not shown) for connection between the wirings 72, 73 in the electric integrated circuit board.

Optical signals introduced from optical fibers in the fiber arrays 67, 68 are processed in the electric integrated circuit board 60, and then are collected via the backplane 90 in the switch card 80, where the signals are subjected to necessary processing, and are again transmitted via the optical fiber in the fiber arrays 67, 78 via the electric integrated circuit board 60.

INDUSTRIAL APPLICABILITY

The present invention provides an optoelectronic integrated circuit board enabling improvement for higher density of optical wirings, reduction of required parts and steps for manufacturing the same, and cost reduction, and also provides an optical communication device using the same.

BRIEF DESCRIPTION OF THE DRAWINGS

FIG. 2B is a view illustrating a state in which a core pattern is formed by processing the material for the first core on the top surface of the cladding layer by photolithography or etching, and then a mirror for changing a light path is formed at a desired position of the core by cutting, etching, or the like;

DESCRIPTION OF SYMBOLS 100, 200, 300, 400: Optoelectronic integrated circuit board
500: optical waveguide array connector
11: Substrate
11a, 11b: multilayered printed board
13a, 13b, 13c, 13d, 13e, 13f, 13g: Core
13b1, 13b2, 13c1, 13c2, 13c3, 13c4, 13e1, 13e2, 13g1: Isolated isolation core
14, 15, 40, 61, 62: Optical waveguide layer
16, 17, 18, 19, 41, 42, 43, 44, 45, 46, 47, 49: Mirror for changing a light path
20, 21, 22, 23, 63, 64: Optical device array
31: Solder bump
35, 66, 74: Optical connector
36, 75: Optical fiber
38, 66: Fiber array
50, 65: Integrated circuit (LSI)
51, 52, 53, 54, 56: Electric wiring
60: Electric integrated circuit board
69, 70, 71: Electronic circuit
72, 73: Electric wiring
80: Switch card
90: Backplane

The invention claimed is:

1. An optoelectronic integrated circuit board comprising:
a substrate;
a plurality of optical waveguide layers that are laminated on the substrate and that each have a core, the core being embedded by a cladding layer and having a refraction index higher than that of the cladding layer;
two mirrors that are formed in each of the optical waveguide layers and that are adapted to change a light path of a light beam propagating in each core to a direction vertical and adapted to cause the light propagating directions in the cores to be opposite to each other;
optical devices that are placed at positions corresponding to positions of the mirrors and that are placed on a top surface of the uppermost optical waveguide layer among the plurality of layers; and
an electric wiring pattern formed on a top surface of the uppermost optical waveguide layer among the plurality of layers;
wherein a portion of the electric wiring pattern is electrically connected to a portion of the optical device; and
wherein transmission and reception of a light beam between the mirror in each of optical waveguide layers lower than the uppermost optical waveguide layer and the optical device are performed via a portion of a core in a layer higher than the lower optical waveguide layer.

2. The optoelectronic integrated circuit board according to claim 1,
wherein, in a core functioning as a light path for light transmission between the lower optical waveguide layer and the optical device, separated and isolated cores are formed in outer sides from the two mirrors facing each other, and transmission and reception of a light beam between the mirrors in the lower optical waveguide layer and the optical devices are performed via the isolated cores.

3. The optoelectronic integrated circuit board according to claim 2, wherein the isolated core has a rectangular form.

4. The optoelectronic integrated circuit board according to claim 2, wherein a surface of the isolated core which a light beam comes in is lager than a surface which the light beam goes out.

5. The optoelectronic integrated circuit board according to claim 1, wherein the optical devices are surface emitting laser diodes or surface illuminating photo detectors.

6. The optoelectronic integrated circuit board according to claim 5, wherein the optical devices are surface emitting laser diodes or surface illuminating photo detectors two-dimensionally arranged.

7. The optoelectronic integrated circuit board according to claim 1, wherein one of the optical devices is an optical fiber having a connector.

8. The optoelectronic integrated circuit board according to claim 7, wherein one of the optical devices is a surface emitting diode or a surface illuminating photo detector two-dimensionally arranged, and another one of the optical devices is an optical fiber two-dimensionally arranged.

9. The optoelectronic integrated circuit board according to claim 1, wherein a space between centers of cores in each of the plurality of optical waveguide layers is smaller than that between the optical devices arranged at positions of the mirrors.

10. The optoelectronic integrated circuit board according to claim 1, wherein the substrate is a multilayered printed wiring board, and the multilayered print wiring pattern and the electric wiring pattern are electrically connected to each other through a through-hole.

11. A transmission device configured based on an optoelectronic integrated circuit board, the transmission device comprising:
- a line card having a first optical signal processing section for processing an optical signal input from the outside mounted thereon;
- a switch card having a second signal processing section for processing an optical signal transmitted via an optical wiring from the line card; and
- a backplane on which an optical wiring for optically connecting the line card and the switch card to each other is formed;

wherein the first line card comprises:
- a substrate;
- a plurality of optical waveguide layers laminated on the substrate, each of the layers embedded by a cladding layer and made of a material having a refraction index higher than that of the cladding layer;
- two mirrors that are formed in each of the optical waveguide layers and that are adapted to change a light path of a light beam propagating in each core to a direction vertical and adapted to cause the light propagating directions in the cores to be opposite to each other;
- optical devices that are placed at positions corresponding to positions of the mirrors and that are placed on a top surface of the uppermost optical waveguide layer among the plurality of layers; and
- an electric wiring pattern formed on a top surface of the uppermost one among the plurality of optical waveguide layers;

wherein a portion of the electric wiring pattern and a portion of the optical device is electrically connected; and wherein transmission and reception of a light beam between the mirror in each of optical waveguide layers lower than the uppermost optical waveguide layer and the optical device are performed via a portion of a core in a layer higher than the lower optical waveguide layer.

* * * * *